(12) United States Patent
Nakamura (10) Patent No.: US 8,578,911 B2
(45) Date of Patent: Nov. 12, 2013

(54) MULTI-LAYER PIEZOELECTRIC ELEMENT, AND INJECTION DEVICE AND FUEL INJECTION SYSTEM USING THE SAME

(75) Inventor: Shigenobu Nakamura, Kirishima (JP)

(73) Assignee: Kyocera Corporation, Kyoto (JP)

( * ) Notice: Subject to any disclaimer, the term of this patent is extended or adjusted under 35 U.S.C. 154(b) by 303 days.

(21) Appl. No.: 13/056,625

(22) PCT Filed: Jul. 27, 2009

(86) PCT No.: PCT/JP2009/063341
§ 371 (c)(1),
(2), (4) Date: Mar. 2, 2011

(87) PCT Pub. No.: WO2010/013670
PCT Pub. Date: Feb. 4, 2010

(65) Prior Publication Data
US 2011/0155104 A1    Jun. 30, 2011

(30) Foreign Application Priority Data
Jul. 29, 2008  (JP) .................................. 2008-194589

(51) Int. Cl.
*F02M 51/06* (2006.01)

(52) U.S. Cl.
USPC .......................................... 123/490; 310/365

(58) Field of Classification Search
USPC ......... 123/490, 498; 239/585.1; 310/364–365
See application file for complete search history.

(56) References Cited

U.S. PATENT DOCUMENTS

| | | | | |
|---|---|---|---|---|
| 4,780,639 A | * | 10/1988 | Shirasu | 310/328 |
| 5,196,757 A | * | 3/1993 | Omatsu | 310/358 |
| 5,459,371 A | * | 10/1995 | Okawa et al. | 310/363 |
| 8,004,155 B2 | | 8/2011 | Nakamura | |
| 8,276,567 B2 | * | 10/2012 | Nakamura | 123/494 |
| 2005/0120528 A1 | | 6/2005 | Okuda et al. | 29/25.35 |
| 2007/0205700 A1 | | 9/2007 | Okamura et al. | |

(Continued)

FOREIGN PATENT DOCUMENTS

| CN | 1856885 A | 11/2006 |
|---|---|---|
| EP | 1675190 A1 | 6/2006 |

(Continued)

OTHER PUBLICATIONS

Chinese language office action dated Nov. 26, 2012 and its English language translation issued in corresponding Chinese application 200980129835.4.

*Primary Examiner* — Hai Huynh
(74) *Attorney, Agent, or Firm* — DLA Piper LLP (US)

(57) ABSTRACT

Provided is a highly durable multi-layer piezoelectric element wherein an external electrode has less possibilities of being peeled off from a side face of a stacked body even when the element is continuously driven for a long period of time in a high electrical field under high pressure. In a multi-layer piezoelectric element (1), a void (2) is formed in a joining interface between a side face of a stacked body (7) wherein piezoelectric layers (3) and internal electrode layers (5) are alternately laminated and an external electrode (9) joined to the side face. Since stress generated in the joining interface between the side face of the stacked body (7) and the external electrode (9) during driving can be reduced by the void (2), there are less possibilities of having the external electrode (9) peeled off from the side face of the stacked body (7) even when the element is continuously driven for a long period of time.

9 Claims, 6 Drawing Sheets

(56) References Cited

U.S. PATENT DOCUMENTS

| | | | |
|---|---|---|---|
| 2008/0007143 A1 | 1/2008 | Nakamura et al. | 310/358 |
| 2008/0303385 A1 | 12/2008 | Okamura et al. | |
| 2009/0045701 A1 | 2/2009 | Okamura et al. | |
| 2009/0045702 A1 | 2/2009 | Okamura et al. | |
| 2010/0282874 A1 | 11/2010 | Nakamura et al. | |
| 2011/0168806 A1* | 7/2011 | Nakamura | 239/102.2 |
| 2012/0187212 A1* | 7/2012 | Hira | 239/102.2 |

FOREIGN PATENT DOCUMENTS

| | | | | |
|---|---|---|---|---|
| JP | 06-283777 | | 10/1994 | |
| JP | 7-111346 | * | 4/1995 | H10L 41/083 |
| JP | 07-169999 | | 7/1995 | |
| JP | 2001-25268 | * | 1/2001 | H01L 41/083 |
| JP | 2003101092 A | | 4/2003 | |
| JP | 2003197991 A | | 7/2003 | |
| JP | 2004241590 A | | 8/2004 | |
| JP | 2004297043 A | | 10/2004 | |
| JP | 2005-174974 | | 6/2005 | |
| JP | 2006-066878 | | 3/2006 | |
| JP | 2006-185932 | * | 7/2006 | H01L 41/083 |
| JP | 2006-210423 | | 8/2006 | |
| JP | 2008-10475 | * | 1/2008 | H01L 41/083 |
| JP | 2008053467 A | | 3/2008 | |
| WO | WO 2005/117155 A1 | | 12/2005 | |
| WO | 2007049697 A1 | | 5/2007 | |

* cited by examiner

MULTI-LAYER PIEZOELECTRIC ELEMENT, AND INJECTION DEVICE AND FUEL INJECTION SYSTEM USING THE SAME

TECHNICAL FIELD

The present invention relates to a multi-layer piezoelectric element used for, for example, a driving element (piezoelectric actuator), a sensor element, and a circuit element. Examples of the driving element include a fuel injection device of an automobile engine, a fluid jet device such as an ink jet, a precision positioning device like an optical device, and a vibration prevention device. Examples of the sensor element include a combustion pressure sensor, a knocking sensor, an acceleration sensor, a load sensor, an ultrasonic sensor, a pressure-sensitive sensor, and a yaw rate sensor. Additionally, examples of the circuit element include a piezoelectric gyroscope, a piezoelectric switch, a piezoelectric transformer, and a piezoelectric breaker.

BACKGROUND ART

As external electrodes in a conventional multi-layer piezoelectric element, as disclosed in Patent Literature 1, there are used external electrodes made of conductive paste including a conductive material such as silver, and glass, and adhered to side faces of a stacked body. This conductive paste is applied to the side faces of the stacked body, and is baked to form external electrodes.

In the multi-layer piezoelectric element, it is required to secure a large amount of displacement under a high pressure simultaneously with progress of miniaturization. Therefore, it is required that a higher electric field is applied to the multi-layer piezoelectric element, and the multi-layer piezoelectric element can be used under severe conditions of being continuously driven for a prolonged period of time.

CITATION LIST

Patent Literature

Patent Literature 1: Japanese Unexamined Patent Publication JP-A 2005-174974

DISCLOSURE OF INVENTION

Technical Problem

However, in the multi-layer piezoelectric element using the external electrodes disclosed in Patent Literature 1, portions of the external electrodes may be peeled off from the side faces of the stacked body during use under severe conditions such as a high electric field, a high pressure, or prolonged continuous driving.

This is because stress is generated in joining interfaces between the stacked body and the external electrodes when the stacked body expands and contracts in the lamination direction by applying a voltage. That is, in a case where the piezoelectric element is continuously driven for a prolonged period of time in a high electric field, a problem occurs in that portions of the external electrodes are peeled off from the side faces of the stacked body due to stress repeatedly generated in the joining interfaces between the side faces of the stacked body and the external electrodes, a voltage is no longer supplied to a portion of the piezoelectric body from the external electrodes, and thereby displacement characteristics deteriorate.

The invention has been made in view of the above problems, and an object thereof is to provide a multi-layer piezoelectric element which improves decrease in amount of displacement during use under the above severe conditions.

Solution to Problem

A multi-layer piezoelectric element of the invention comprises a stacked body in which piezoelectric layers and internal electrode layers are alternately laminated; and an external electrode which is joined to a side face of the stacked body and electrically connected to the internal electrode layers, wherein a void is formed in a joining interface between the side face of the stacked body and the external electrode.

Furthermore, the multi-layer piezoelectric element of the invention may be so constituted that the void has a flat shape which is long in a planar direction of the side face of the stacked body.

Furthermore, the multi-layer piezoelectric element of the invention may be so constituted that the void is formed in a portion of the piezoelectric layers in the side face of the stacked body.

Furthermore, the multi-layer piezoelectric element of the invention may be so constituted that the external electrode comprises a glass layer in a surface portion of a joining face with the piezoelectric layers.

Furthermore, the multi-layer piezoelectric element of the invention may be so constituted that the void is formed in a portion of the piezoelectric layers between mutually adjacent internal electrode layers in the side face of the stacked body.

Furthermore, the multi-layer piezoelectric element of the invention may be so constituted that the void is formed in a plurality.

Furthermore, the multi-layer piezoelectric element of the invention may be so constituted that the void is configured to be a closed space.

An injection device of the invention comprises a multi-layer piezoelectric element according to any one of the inventions mentioned above; and an injection nozzle, wherein a liquid stored in the container is configured to be injected through the injection nozzle by driving the multi-layer piezoelectric element.

A fuel injection system of the invention comprises a common rail configured to store high-pressure fuel; the injection device mentioned above configured to inject the high-pressure fuel stored in the common rail; a pressure pump configured to supply the high-pressure fuel to the common rail; and an injection control unit configured to send a driving signal to the injection device.

Advantageous Effects of Invention

According to the multi-layer piezoelectric element of the invention, since the void is formed in the joining interface between the side face of the stacked body and the external electrode. Therefore, stress generated in the joining interface between the side face of the stacked body and the external electrode during expansion and contraction of the stacked body can be reduced by the presence of the void. Therefore, it is possible to effectively prevent a portion of the external electrode from being peeled off from the side face of the stacked body, and it is possible to prevent occurrence of a problem that the displacement characteristics of the stacked body deteriorate.

Additionally, according to the injection device of the invention, the injection device comprises the multi-layer piezoelectric element of the invention serving as a multi-layer piezoelectric element configured to inject a liquid stored within a container through an injection nozzle. Therefore, it is possible to prevent a portion of the external electrode from being peeled off from the side face of the stacked body in the multi-layer piezoelectric element and it is possible to prevent the displacement characteristics of the stacked body from deteriorating. Thus, desired injection of a liquid can be stably performed for a prolonged period of time.

Moreover, according to the fuel injection system of the invention, the fuel injection system includes the injection device of the invention as a device configured to inject the high-pressure fuel stored into the common rail. Thus, desired injection of high-pressure fuel can be stably performed for a prolonged period of time.

DESCRIPTION OF EMBODIMENTS

Now referring to the drawings, preferred embodiments of a multi-layer piezoelectric element according to the invention are described below.

Figure 1:
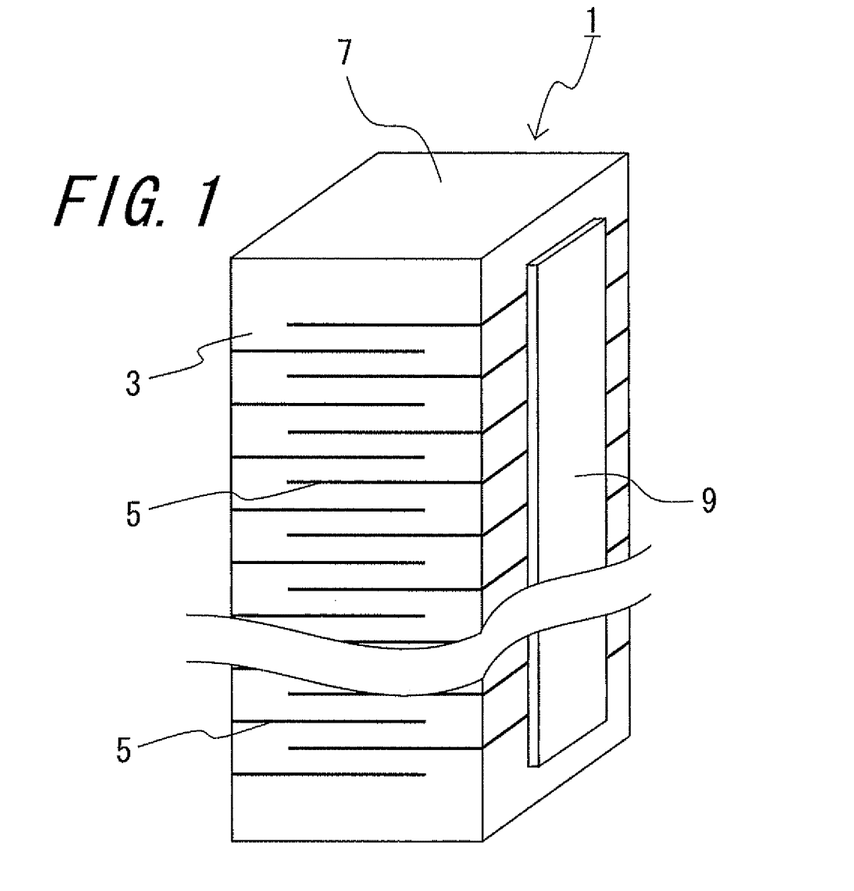
FIG. 1 is a perspective view showing a multi-layer piezoelectric element according to an embodiment of the invention.
Figure 2:
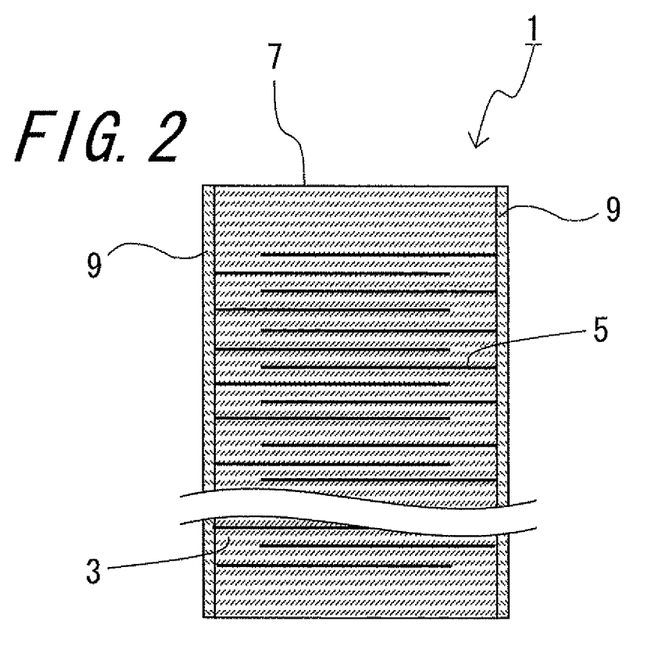
FIG. 2 is a sectional view showing a section parallel to a lamination direction of a stacked body of the multi-layer piezoelectric element according to the embodiment of the invention.
Figure 3:
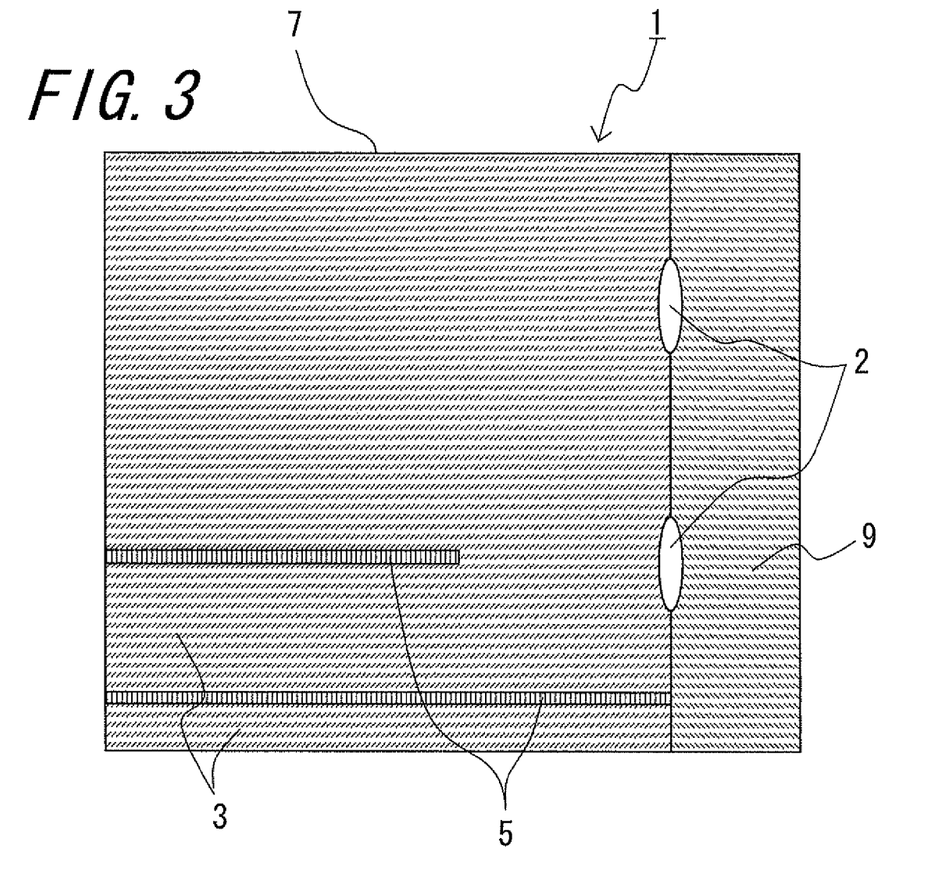
FIG. 3 is an enlarged sectional view near a joining interface between a side face of the stacked body and an external electrode in the multi-layer piezoelectric element shown in FIG. 2.

FIG. 1 is a perspective view showing a multi-layer piezoelectric element according to an embodiment of the invention. FIG. 2 is a sectional view showing a section parallel to a lamination direction of a stacked body of the multi-layer piezoelectric element shown in FIG. 1. FIG. 3 is an enlarged sectional view near a joining interface between a side face of the stacked body and an external electrode in the multi-layer piezoelectric element shown in FIG. 2.

As shown in FIG. 3, the multi-layer piezoelectric element 1 of the present embodiment comprises a stacked body 7 in which piezoelectric layers 3 and internal electrode layers 5 are alternately laminated, and an external electrode 9 which is joined to a side face of the stacked body 7 and is electrically connected to the internal electrode layers 5. Voids 2 are formed in a joining interface between the side face of the stacked body 7 and the external electrode 9, the voids 2 separating the side face of the stacked body 7 and the joining face of the external electrode 9.

By providing the joining interface between the external electrode 9 and the stacked body 7 with the voids 2 in this way, stress repeatedly generated at the joining interface between the stacked body 7 and the external electrode 9 when the stacked body 7 has expanded and contracted can be reduced by the presence of the voids 2, and it is thereby possible to suppress peeling-off of a portion of the external electrode 9 from the side face of the stacked body 7 due to the stress.

The voids 2 are interposed between the stacked body 7 and the external electrode 9 in order to separate the joining face between the side face of the stacked body 7 and the external electrode 9 in these void portions. The shape of the void 2 seen from the external electrode 9 side is not particularly limited, and may be a shape such as a circular shape or an elliptical shape. Additionally, as for the size of the void 2, it is preferable that the thickness (the size of the external electrode 9 in the thickness direction) be about 0.1 to 5 μm when the thickness of the external electrode 9 is 10 to 50 μm. As for the size seen from the external electrode 9 side, when the voids have a circular shape, it is preferable that the diameter (the size seen from the external electrode 9 side) be about 0.5 to 50 μm.

Additionally, it is preferable that the void 2 has a flat shape which is long in the planar direction of the side face of the stacked body 7. That is, when the shape of the void 2 is a flat shape which is long in the planar direction of the side face of the stacked body 7, the ratio of the area occupied by the voids 2 in the joining interface between the stacked body 7 and the external electrode 9 can be increased. Thus, stress generated between the external electrode 9 and the side face of the stacked body 7 can be effectively reduced without increasing the thickness of the external electrode 9 unnecessarily.

Here, the planar direction of the side face of the stacked body 7 means a direction parallel to the side face of the stacked body 7. Accordingly, the planar direction does not necessarily indicate specific directions such as an up-and-down direction or a right-and-left direction. That is, all directions parallel to the side face of the stacked body 7 will be called the planar direction of the side face of the stacked body 7. Accordingly, for example, the shape of the void may be a flat shape which is long in the lamination direction of the stacked body 7, and may be a flat shape which is long in a direction orthogonal to the lamination direction of the stacked body 7, and may be a flat shape which is long in directions other than these directions. In addition, here, the direction orthogonal to the lamination direction of the stacked body 7 is a direction along the internal electrode layers 5 exposed from the side face of the stacked body 7 in the side face of the stacked body 7 shown in FIG. 1.

Additionally, it is preferable that, in a case where the void 2 having a flat shape which is long in the planar direction of the side face of the stacked body 7 is a circular shape seen from the external electrode 9 side, the thickness is about 0.5 to 5 μm, the diameter seen from the external electrode 9 side is about 0.5 to 50 μm, and the diameter of the void 2 is two or more times as large as the thickness of the void 2.

By setting the thickness and the diameter to be within these ranges, stress generated between the external electrode 9 and the side face of the stacked body 7 can be more effectively reduced.

In addition, in a case where the void 2 has a shape which is long in the planar direction of the side face of the stacked body 7, its longitudinal direction may be a longitudinal direction extending along the lamination direction of the stacked body 7 or may be a longitudinal direction extending along the direction orthogonal to the lamination direction. Especially, the long shape along the direction orthogonal to the lamination direction of the stacked body 7 is preferable from the viewpoint that stress generated due to the expansion and contraction of the stacked body 7 is efficiently dispersed. Additionally, the void 2 of a shape which is long along the lamination direction of the stacked body 7, and the void 2 of a shape which is long along the direction orthogonal to the lamination direction may coexist.

Moreover, it is preferable that the void 2 is formed in a portion of the piezoelectric layers 3 in the side face of the stacked body 7 so as to come, into contact with the piezoelectric layers 3. By adopting the portion of the piezoelectric layers 3 in the side face of the stacked body 7 as the formation portions of the voids 2, stress generated between the external electrode 9 and the side face of the stacked body 7 can be reduced while maintaining a satisfactory conductive connection between the external electrode 9 and the internal electrode layers 5. In a case where the void 2 is formed in the portion of the piezoelectric layers 3 in the side face of the stacked body 7, it is preferable that the shape of the void 2 is a flat shape which is long in the direction along the side face of the piezoelectric layer 3 so that the thickness of the external electrode 9 does not partially increase unnecessarily. That is, since the shape of the void 2 is a flat shape which is long in the direction along the side face of the piezoelectric layer 3 and is thin between the piezoelectric layer 3 and the external electrode 9, deviations in the dimension of the stacked body 7 including the thickness of the external electrode 9 becomes small, and the multi-layer piezoelectric element 1 with excellent dimensional precision can be supplied.

Figure 4:
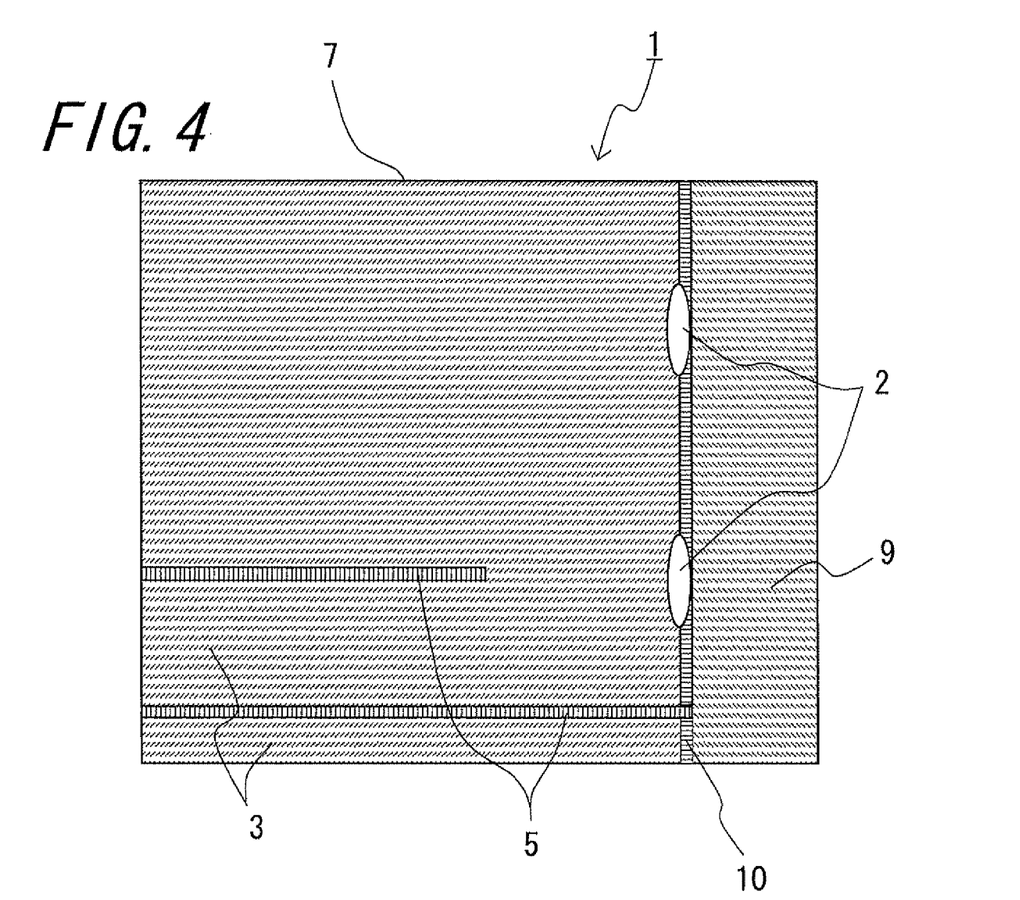
FIG. 4 is an enlarged sectional view showing an example in which the external electrode comprises a glass layer in a surface portion of a joining part with a side face of the stacked body.

Additionally, as shown in FIG. 4 by an enlarged sectional view similar to FIG. 3, it is preferable that the external electrode 9 comprises a glass layer 10 in a surface portion of the joining face with the piezoelectric layers 3 of the stacked body 7. FIG. 4 is an enlarged sectional view showing an example in which the external electrode 9 comprises the glass layer 10 in the surface portion of the joining face with the piezoelectric layers 3 of the stacked body 7. That is, by forming the glass layer 10 having a high joining strength with the piezoelectric layers 3 in the surface portion (stacked portion corresponding to the surface of the external electrode 9 nearest to the stacked body 7) of the external electrode 9 which becomes a joining face with the piezoelectric layers 3 among the side faces of the stacked body 7, the joining strength of the external electrode 9 to the side face of the stacked body 7 can be made more robust in the piezoelectric layer 3 other than a portion in which the void 2 is formed.

In order to form the glass layer 10 in the surface portion of the external electrode 9 at the joining face with the piezoelectric layers 3 among the side faces of the stacked body 7 in this way, the external electrode 9 may be baked at a temperature higher than the softening temperature of a glass component included in the silver glass conductive paste which forms the external electrode 9.

Moreover, in order to form the glass layer 10 effectively, the external electrode 9 having a structure in which two or more layers of silver glass conductive paste are superimposed on each other may be formed and baked. In that case, a layer of silver glass conductive paste formed nearest to the side face of the stacked body 7 may have a large content of glass as compared to other layers of silver glass conductive paste. Thereby, in a case where a glass component having excellent wettability with the piezoelectric layers 3 is used as the glass component of the silver glass conductive paste, when a structure formed of a plurality of layers of silver glass conductive paste which forms the external electrode 9 is baked, the glass component in the silver glass conductive paste softens, and flows toward the side face of the piezoelectric layers 3 among the side faces of the stacked body 7. Accordingly, the glass component can be segregated on the joining face with the piezoelectric layers 3 of the stacked body 7 during baking. As a result, the glass layer 10 can be effectively formed in the surface portion of the joining face of the external electrode 9 with the piezoelectric layers 3 among the side faces of the stacked body 7.

As the glass component made to be contained in the silver glass conductive paste in order to form the glass layer 10 on the external electrode 9, silica glass, soda lime glass, lead alkali silicate glass, aluminoborosilicate glass, borosilicate glass, aluminosilicate glass, borate glass, or phosphate glass whose softening temperature is 600 to 950° C., can be used. Additionally, it is preferable that the amount of the glass component contained in the layer of silver glass conductive paste formed nearest to the side face of the stacked body 7 in the external electrode 9 is about 5 to 20% by mass, and, the amount of the glass component contained in the other layers is about 0.01 to 5% by mass.

Additionally, in order to make the electric connection satisfactory between the internal electrode layers 5 and the external electrode 9, it is preferable that silver particles are made to be contained in the silver glass conductive paste by an amount of about 80 to 95% by mass. Thereby, even in a case where the glass layer 10 is formed, the electric connection of the external electrode 9 to the internal electrode layers 5 can be secured well.

Additionally, when the thickness of the glass layer 10 is set to 1 to 5 μm, for example, while the thickness of the external electrode 9 is 10 to 50 μm, and is set to about 1/10 of the thickness of the external electrode 9, the joining strength of the external electrode 9 to the side face of the stacked body 7 is increased well, which is preferable.

In addition, although an example in which the void 2 is located in the interface of the glass layer 10 and the stacked body 7 which is the surface portion of the external electrode 9 is shown in FIG. 4, the void 2 in a case where the glass layer 10 is formed may be located nearer the external electrode 9 with respect to the glass layer 10, or may be formed so as to be brought into contact with the side face of the stacked body 7 and be located at the joining interface between the side face of the stacked body 7 and the external electrode 9 so that the stress between the stacked body 7 and the external electrode 9 can be reduced.

Moreover, it is preferable that the void 2 is formed in the portion of the piezoelectric layers 3 between mutually adjacent internal electrode layers 5 in the side face of the stacked body 7, i.e., in the portion of the side face of the piezoelectric layers 3 in the side face of the stacked body 7. It is thereby possible is to effectively reduce stress generated between the external electrode 9 and the side face of the stacked body 7, while keeping satisfactory conduction between the external electrode 9 and the internal electrode layers 5. In a case where the void 2 is formed in the portion of the piezoelectric layers 3 between mutually adjacent internal electrode layers 5 in the side face of the stacked body 7, it is preferable that the shape of the void 2 is a flat shape which is long in the direction along the side face of the piezoelectric layers 3 between the mutual adjacent internal electrode layers 5 so that the thickness of the external electrode 9 does not partially increase unnecessarily. The void 2 in this case may have, for example, a belt shape which is long and thin along the piezoelectric layers 3, and a flat shape in which the portions between the piezoelectric layers 3 and the external electrode 9 are thin and flat such that the width of the void is almost equal to or smaller than the thickness of the piezoelectric layer 3.

Additionally, since it may not necessarily be enough to form only one void 2 in the external electrode 9, it is preferable that a plurality of voids are formed in the joining interface between the side face of the stacked body 7 and the external electrode 9. By forming the plurality of voids 2, the stress-reducing effect between the external electrode 9 and the side face of the stacked body 7 can be enhanced. Even in a case where the multi-layer piezoelectric element 1 has been continuously driven at a high electric field and at high speed, it is possible to more effectively prevent occurrence of a problem where a portion of the external electrode 9 is peeled off from the side face of the stacked body 7 and displacement characteristics deteriorate. It is preferable that the number density of the voids 2 which are formed plurally be about 50 to 1000 pieces/mm$^2$. Additionally, it is preferable that the ratio of the area occupied by the voids 2 in the joining interface between the side face of the stacked body 7 and the external electrode 9 be about 0.1 to 5%. By setting the thickness and the diameter to be within these ranges, stress generated between the external electrode 9 and the side face of the stacked body 7 can be more effectively reduced while securing the joining strength.

In a case where the plurality of voids 2 are formed and the voids 2 are formed in the portions of the piezoelectric layers 3 between the internal electrode layers 5, it is preferable that one or more voids 2 exist in at least the portion of each piezoelectric layer 3 between the internal electrode layers 5. Thereby, stress can be alleviated in the portion of each piezoelectric layer 3 between the internal electrode layers 5. Additionally, it is preferable that the voids 2 are substantially uniformly distributed both in the lamination direction of the stacked body 7 and the direction orthogonal to the lamination direction. Thereby, stress can be alleviated over the entire surface within a range in which the voids 2 are distributed.

Moreover, it is desirable that the void 2 is configured to be a closed space. The void 2 is formed as a closed space, and thereby, the air which exists in the closed space serves as a cushion. This can effectively prevent the void 2 from collapsing due to stress generated by an external force, and can reduce stress generated between the external electrode 9 and the side face of the stacked body 7 for a prolonged period of time. In addition, as the case the void 2 is not configured to be a closed space, there is a case where a portion of void 2 is exposed to the surface of the external electrode 9 on the atmospheric side and the void 2 has an opening on the surface of the external electrode 9, and a case where the void 2 is formed in an outer peripheral edge of the external electrode 9, and the void 2 has an opening in the outer peripheral edge of the external electrode 9. Additionally, in the case where the void 2 is configured to be a closed space, the plurality of voids 2 may form an overall closed space in a state where the voids are joined together. Even in this case, the effect of reducing stress generated between the external electrode 9 and the side face of the stacked body 7 is further enhanced.

Next, a method of manufacturing the multi-layer piezoelectric element 1 of the present embodiment will be described.

First, ceramic green sheets which become the piezoelectric layers 11 are fabricated. Specifically, calcined powder of piezoelectric ceramics, a binder made of an organic polymer such as acrylics or butyrals, and a plasticizer are mixed together to prepare slurry. Also, from this slurry, a ceramic green sheet is prepared by using well-known tape casting methods such as a doctor blade method and a calender roll method. As the piezoelectric ceramics, those having piezoelectric characteristics may be adopted. For example, perovskite-type oxide made of PbZrO$_3$—PbTiO$_3$ or the like can be used. Additionally, DBP (dibutyl phthalate), DOP (dioctyl phthalate), or the like can be used as the plasticizer.

Next, a conductive paste which becomes the internal electrode layers 5 is prepared. Specifically, the conductive paste can be prepared by adding and mixing a binder, and a plasticizer to metal powder of silver (Ag)-palladium (Pd). This conductive paste is printed in the pattern of the internal electrode layers 5 on the above ceramic green sheet, using a screen printing method. Moreover, after a plurality of ceramic green sheets on which this conductive paste has been printed is laminated, and the resulting stacked body is subjected to binder removal at a predetermined temperature, the stacked body is fired at 900 to 1150° C. Thereby, the stacked body 7 including the piezoelectric layers 3 and the internal electrode layers 5 which are alternately laminated can be formed.

In addition, the stacked body 7 is not limited to one prepared by the above manufacturing method. As long as the stacked body 7 prepared by alternately laminating a plurality of piezoelectric layers 3 and a plurality of internal electrode layers 5, the stacked body may be formed by any kind of manufacturing methods.

Next, the stacked body 7 obtained by firing is ground using a surface grinder or the like so as to a predetermined shape.

Thereafter, the silver glass conductive paste, which has been prepared by adding a binder, a plasticizer, and a solvent to conductive agent powder made mainly of silver, and glass powder, is printed in the pattern of the external electrodes 9 on the side faces of the stacked body 7 by screen printing or the like. Thereafter, the external electrodes 9 can be formed by performing drying and baking at a predetermined temperature.

In order to form the voids 2 which are interposed between the side faces of the stacked body 7 and the joining faces of the external electrodes 9 to thereby separate these side faces and joining faces, in the joining interfaces therebetween, the voids can be formed by applying a void material burned out (dissipated) during baking of the external electrodes 9 to the portions where the voids 2 are to be formed in advance, before the silver glass conductive paste which becomes the external electrodes 9 after baking is printed on the side faces of the stacked body 7 which form the external electrodes 9. That is, the void material constituted by a material which is burned out during baking of the external electrodes 9 is printed with the size and shape of the voids 2 on the side faces of the stacked body 7, and the silver glass conductive paste which forms the external electrodes 9 are printed from above the void material, whereby the void material is burned out during baking. Thereby, the desired voids 2 can be formed in the joining interfaces between the side faces of the stacked body 7 and the external electrodes 9.

Here, as the void material, carbon powder or beads made of organic resin such as an acrylic bead, is preferable. The void material paste obtained by adding and mixing the binder to the void material is applied in advance to the portions of the side faces of the stacked body 7 where the voids 2 are to be formed by screen printing, ink jet printing, or the like, and thereafter, the silver glass conductive paste which becomes the external electrodes 9 is printed and baked. Thereby, the voids 2 can be formed at desired places of the joining interfaces between the side faces of the stacked body 7, and the external electrodes 9.

In addition, the voids 2 having a flat shape which is long in the planar direction of the side faces of the stacked body 7 can also be obtained by applying using flat acrylic beads for the void material so as to be arranged parallel to the planar direction.

Additionally, in order to form the voids 2 in the joining interfaces between the side faces of the stacked body 7 and the external electrodes 9, the following may be performed.

For example, in a case where external electrodes which are adhered to the stacked body 7 after being formed with a predetermined shape and size are used as the external electrodes 9, a method of making the faces of the surfaces of the external electrodes 9 which come into contact with the side faces of the stacked body 7 into roughened faces in which recesses equivalent to the voids 2 are formed can be employed. For example, a method of processing the faces of the external electrodes 9 into roughened faces by sandblasting or the like may be employed. In this case, a number of minute recesses are formed in the faces of the surfaces of the external electrodes 9 which come into contact with the side faces of the stacked body 7. Accordingly, when the faces of the external electrodes 9 processed into the roughened faces by this sandblasting or the like, are made to abut on the side faces of the stacked body 7, since air easily enters the portions in the faces of the external electrodes 9 in which minute recesses exist, the voids 2 are formed in the joining interfaces after being joined to the side faces of the stacked body 7.

Additionally, in a case where the voids 2 are formed in the joining interfaces between the side faces of the stacked body 7 and the external electrodes 9 by processing the joining interfaces of the external electrodes 9 with the stacked body 7 by sandblasting, since the size of the voids 2 can be adjusted to some degree by adjusting the size of the particles for performing sandblasting, this is preferable.

Next, the stacked body 7 in which the external electrodes 9 have been formed is immersed in a resin solution including sheathing resin made of silicone rubber. Then, by vacuum-deaerating the silicone resin solution, the silicone resin is brought into close contact with concavo-convex portions of the outer peripheral side face of the stacked body 7, and thereafter, the stacked body 7 is pulled up from the silicone resin solution. Thereby, the silicone resin is coated on the side faces of the stacked body 7 on which the external electrodes 9 have been formed. Then, lead wires serving as power feeding portions are connected to the external electrodes 9 with a conductive adhesive or the like.

Thereafter, the multi-layer piezoelectric element 1 of the present embodiment is completed by applying a direct-current voltage of 0.1 to 3 kV/mm to the pair of external electrodes 9, and by polarizing the piezoelectric layers 3 which constitute the stacked body 7. According to this multi-layer piezoelectric element 1, the individual piezoelectric layers 3 can be greatly displaced by an inverse piezoelectric effect by connecting the external electrodes 9 and an external power source via the lead wires, and applying a voltage to the piezoelectric layers 3. Thereby, for example, it is possible to make the multi-layer piezoelectric element function as a fuel injection valve for an automobile, which injects and supplies fuel to an engine.

Figure 5:
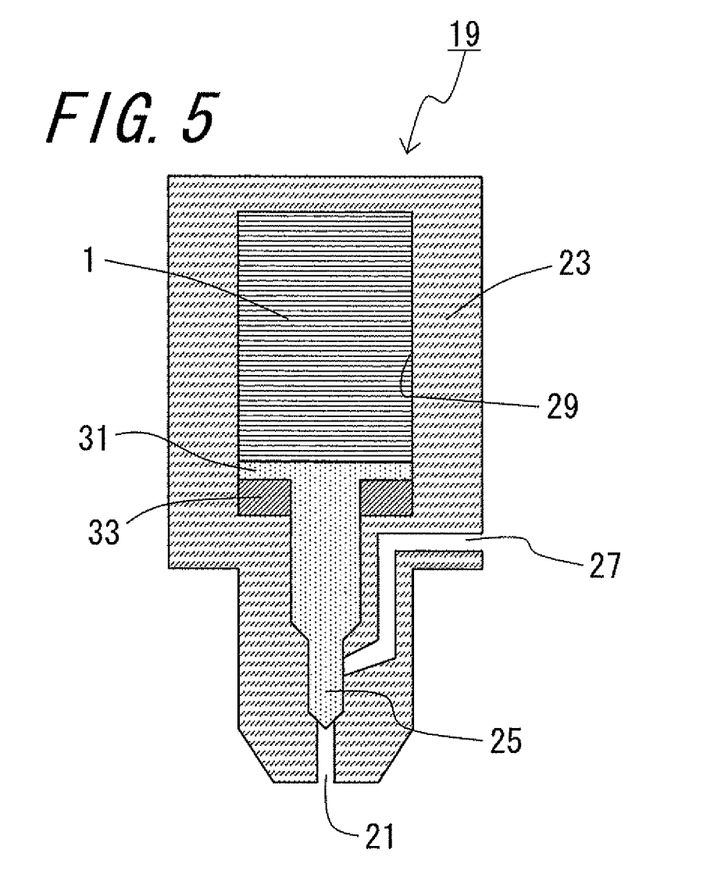
FIG. 5 is a schematic sectional view showing an injection device according to an embodiment of the invention.

Next, an injection device according to an embodiment of the invention will be described. FIG. 5 is a schematic sectional view showing an injection device according to an embodiment of the invention.

As shown in FIG. 5, in the injection device 19 of the present embodiment, the multi-layer piezoelectric element 1 represented by the above embodiment is housed inside a housing container 23 which has an injection nozzle 21 at its one end.

A needle valve 25 capable of opening and closing the injection nozzle 21 is disposed within the housing container 23. A fluid passage 27 is disposed in the injection nozzle 21 so as to be capable of communicating with the injection nozzle 21 according to the movement of the needle valve 25. The fluid passage 27 is connected to an external fluid supply source from which a fluid is supplied to the fluid passage 27 always at a high pressure. Accordingly, when the needle valve 25 opens the fluid passage 27 leading to the injection nozzle 21, the fuel which has been supplied to the fluid passage 27 is injected to the outside or an adjacent container, for example, a combustion chamber (not shown) of an internal combustion engine, through the injection nozzle 21.

Additionally, the upper end of the needle valve 25 has a larger internal diameter, and has arranged therein a piston 31 slidable on a cylinder 29 formed in the housing container 23. Then, the multi-layer piezoelectric element 1 of the invention as mentioned above is housed in the housing container 23.

In such an injection device 19, when a voltage is applied to the multi-layer piezoelectric element 1, and the multi-layer piezoelectric element elongates, the piston 37 is pressed, and the needle valve 25 blocks the fluid passage 27 leading to the injection nozzle 21 to stop the supply of the fluid. Additionally, when the application of a voltage is stopped, the multi-layer piezoelectric element 1 contracts, the dish spring 33 pushes back the piston 31, the fluid passage 27 is opened, and the injection nozzle 21 communicates with the fluid passage 27 so that injection of the fuel is performed from the injection nozzle 21.

In addition, a voltage is applied to the multi-layer piezoelectric element 1, thereby opening the fluid passage 27, and the application of a voltage is stopped, thereby blocking the fluid passage 27.

Additionally, the injection device 19 of the invention includes a container having the injection nozzle 21, and the multi-layer piezoelectric element 1 of the invention, and may be constructed so that a fluid stored in the container is configured to be injected through the injection nozzle 21 by driving the multi-layer piezoelectric element 1. That is, the multi-layer piezoelectric element 1 is not necessarily housed inside the container, and may be constructed so that the pressure for controlling the injection of the fluid is applied to the inside of the container by driving the multi-layer piezoelectric element 1. In addition, in the present invention, various liquid fluids (conductive paste or the like) other than fuel or ink, and gases are included in the fluid. By using the injection device 19 of the invention, the flow rate and injection timing of the fluid can be stably controlled for a prolonged period of time.

When the injection device 19 of the invention which has adopted the multi-layer piezoelectric element 1 of the invention is used for an internal combustion engine, fuel can be injected into a combustion chamber of an internal combustion engine, such as an engine, with high precision for a longer period of time compared to a conventional injection device.

Figure 6:
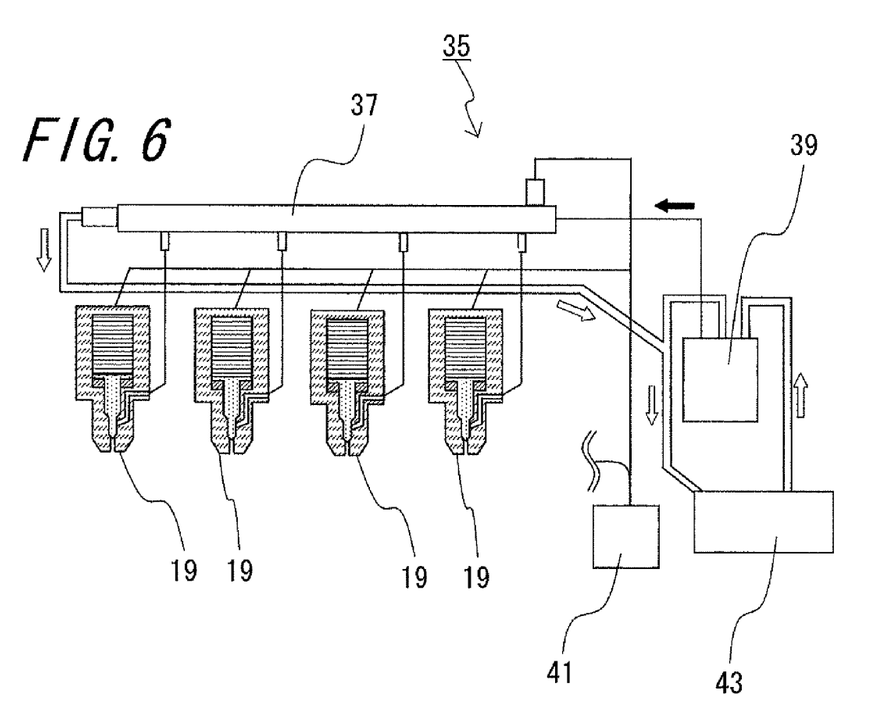
FIG. 6 is a schematic configuration diagram showing a fuel injection system according to an embodiment of the invention.

Next, a fuel injection system according to an embodiment of the invention will be described. FIG. 6 is a schematic configuration diagram showing the fuel injection system according to an embodiment of the invention.

As shown in FIG. 6, the fuel injection system 35 of the present embodiment includes a common rail 37 configured to store high-pressure fuel as a high-pressure fluid, a plurality of the injection devices 19 of the invention configured to inject the high-pressure fluid stored in the common rail 37, a pressure pump 39 configured to supply the high-pressure fluid to the common rail 37, and an injection control unit 41 configured to send a driving signal to the injection device 19.

The injection control unit 41 controls the amount and timing of injection of the high-pressure fluid on the basis of external information or a signal from the outside. For example, in a case where the injection control unit 41 is used for fuel injection of the engine, the amount and timing of fuel injection can be controlled while sensing the situation of the engine combustion chamber by a sensor or the like. The pressure pump 39 plays the role of supplying fluid fuel to the common rail 37 at high pressure from the fuel tank 43. For example, the fuel injection system 35 of the engine feeds fluid fuel into the common rail 37 at a high pressure of about 1000 to 2000 atmospheres (about 101 MPa to about 203 MPa), and preferably about 1500 to 1700 atmospheres (about 152 MPa to about 172 MPa). In the common rail 37, the high-pressure fuel sent from the pressure pump 39 is stored and appropriately fed into the injection device 19. The injection device 19 injects a certain amount of fluid to the outside or an adjacent container from the injection nozzle 21 as mentioned above. For example, in a case where an object to which fuel is injected and supplied is an engine, high-pressure fuel is injected in the form of a mist from the injection nozzle 21 to a combustion chamber of the engine.

In addition, the invention is not limited to the above embodiment, and it is perfectly acceptable that various changes are made without departing from the concept of the invention. For example, the external electrodes 9 are not limited to those respectively formed on opposed side faces of the stacked body 7 as in the embodiment shown in FIGS. 1 and 2. Two external electrodes 9 may be formed on adjacent side faces of the stacked body 7, and may be formed on the same side of the stacked body 7. Additionally, the shape of a cross-section in a direction orthogonal to the lamination direction of the stacked body 7 may be polygonal shapes such as a hexagonal shape and an octagonal shape, a circular shape, or combined shapes of a straight line and a circular arc, other than a quadrangular shape which is the above embodiment. Additionally, conductive auxiliary members for allowing a large electric current to flow therethrough may be provided on the outsides of the external electrodes 9. The conductive auxiliary members are metallic wire members, meshes, mesh-like sheets, or the like, are used so as to be connected and fixed to the external electrodes 9 with a conductive adhesive, solder, or the like.

Examples

A piezoelectric actuator including the multi-layer piezoelectric element of the invention was prepared as follows. First, a slurry was prepared which was obtained by mixing calcined powder of piezoelectric ceramics made mainly of lead zirconate titanate ($PbZrO_3$—$PbTiO_3$) with an average particle diameter of 0.4 μm, a binder, and a plasticizer. A ceramic green sheet which becomes a piezoelectric layer 3 with a thickness of 150 μm was prepared using this slurry by a doctor blade method.

Additionally, a binder was added to a silver-palladium alloy, thereby preparing conductive paste which becomes internal electrode layers.

Next, the conductive paste which becomes the internal electrode layers was printed on one side of the ceramic green sheet by a screen printing method, and 300 ceramic green sheets on which the conductive paste was printed were laminated. Then, a stacked body was obtained by performing firing at 980 to 1100° C.

After the obtained stacked body was ground in a predetermined shape using a surface grinder, void material paste in which a binder was added to and mixed with spherical acrylic beads (5 μm in diameter) and flat acrylic beads (10 μm in major axis, 8 μm in minor axis, and 2 μm in thickness) was applied to on the side faces of the stacked body which form external electrodes, silver glass conductive paste which becomes external electrodes was printed on the void material paste, and was baked at 700° C. In addition, the softening point of the glass included in the silver glass conductive paste at this time was 730° C.

Here, in a piezoelectric actuator of Sample Number 1 of a comparative example of the invention which was prepared without applying the void material paste in this way, any void was not observed in the joining interfaces between the side faces of the stacked body and the external electrodes. On the other hand, in a piezoelectric actuator of Sample Number 2 of an example of the invention in which the void material paste using the spherical acrylic beads was applied, spherical voids (3 μm in diameter) were formed in the joining interfaces between the side faces of the stacked body and the external electrodes. In the piezoelectric actuator of Sample Number 3 of an example of the invention in which the void material paste using the flat acrylic beads was applied, voids using the flat acrylic beads (6 μm in major axis, 4 μm in minor axis, and 1 μm in thickness) having a flat shape which is long in the planar direction of the side faces of the stacked body were formed in the joining interfaces between the side faces of the stacked body and the external electrodes.

Additionally, in a piezoelectric actuator of Sample Number 4 of an example of the invention in which the void material paste using the flat acrylic beads was applied, the softening point of the glass component included in the silver glass conductive paste which become external electrodes was then set to 600° C., and baking was performed at 700° C., a glass layer was formed on a surface portion of a joining face of an external electrode to a piezoelectric layer of a stacked body was formed with a thickness of 1 μm. In addition, here, the glass layer was formed by using silica glass as the glass component. Additionally, in a case where this glass layer was formed, the glass layer was formed using a plurality of paste layers by causing a layer nearest to a side face of the stacked body among the layers of silver glass conductive paste which become external electrodes to contain 10% by mass of silica glass and by causing the other layers to contain 2% by mass of silica glass.

Thereafter, lead wires were connected to the external electrodes, and a direct-current electric field of 3 kV/mm was applied to the positive and negative external electrodes, respectively, for 15 minutes via the lead wires, thereby performing polarization treatment. A piezoelectric actuator using a multi-layer piezoelectric element were prepared in this way. When a direct current voltage of 160 V was applied to the obtained piezoelectric actuator, the amount of displacement of 40 μm was obtained in the lamination direction of the stacked body. Moreover, a test was performed in which an alternating voltage of 0 to +160 V was applied to the piezoelectric actuator at a frequency of 150 Hz at room temperature, and the piezoelectric actuator was continuously driven $1\times10^9$ times to $1\times10^{10}$ times. The obtained results are shown in Table 1.

TABLE 1

| Sample Nos. | Void in Joining Interface between Side Face of Stacked Body and External Electrode | Shape of Void | Glass Layer on Surface Portion of Joining Face of External Electrode | Amount of Displacement after Continuous Driving | |
|---|---|---|---|---|---|
| | | | | After $1 \times 10^9$ Times | After $1 \times 10^{10}$ Times |
| 1 | No | — | No | Reduced to ½ | Reduced to ¼ |
| 2 | Yes | Spherical | No | No Change | Reduced to ⅘ |
| 3 | Yes | Flat | No | No Change | No Change |
| 4 | Yes | Flat | Yes | No Change | No Change |

As can be seen from the results shown in Table 1, in the piezoelectric actuator of Sample Number 1 which is a comparative example of the invention, any void did not exist in the joining interfaces between the side faces of the stacked body and the external electrodes. Therefore, stress generated between the side faces of the stacked body and the external electrodes during driving could not be alleviated, portions of the external electrodes were peeled off from the side faces of the stacked body after driving of $1 \times 10^9$ times, and displacement characteristics deteriorated to ½. On the other hand, in the piezoelectric actuators of Sample Numbers 2 to 4 which are examples of the invention, voids are formed in the joining interfaces between side face of the stacked body and the external electrodes in order to separate the side faces of the stacked body and the joining faces of the external electrodes in these void portions. Therefore, the voids can absorb and alleviated stress repeatedly generated in the joining interfaces between the side faces of the stacked body and the external electrodes during driving. Thus, a problem that portions of the external electrodes are peeled off from the side faces of the stacked body after driving of $1 \times 10^9$ times, and displacement characteristics deteriorate did not occurred.

Moreover, in the piezoelectric actuator of Sample Number 3 in which the shape of the voids has a flat shape which is long in the planar direction of the side faces of the stacked body, and in the piezoelectric actuator of Sample Number 4 in which the glass layer was formed on the surface portions of the joining faces of the external electrodes to the side faces of the stacked body in addition to this, it was found that portions of the external electrodes did not peel off from the side faces of the stacked body, displacement characteristics did not deteriorate even after continuous driving of $1 \times 10^{10}$ times, and high durability was provided.

REFERENCE SIGNS LIST

1: Multi-layer piezoelectric element
2: Void
3: Piezoelectric layer
5: Internal electrode layer
7: Stacked body
9: External electrode
10: Glass layer
19: Injection device
21: Injection nozzle
23: Housing container
25: Needle valve
27: Fluid passage
29: Cylinder
31: Piston
33: Dish spring
35: Fuel injection system
37: Common rail
39: Pressure pump
41: Injection control unit
43: Fuel tank

The invention claimed is:

1. A multi-layer piezoelectric element, comprising:
a stacked body in which piezoelectric layers and internal electrode layers are alternately laminated; and
an external electrode which is joined to a side face of the stacked body and electrically connected to the internal electrode layers, wherein
a void is formed in a joining interface between the side face of the stacked body and the external electrode.

2. The multi-layer piezoelectric element according to claim 1, wherein the void has a flat shape which is long in a planar direction of the side face of the stacked body.

3. The multi-layer piezoelectric element according to claim 1, wherein the void is formed in a portion of the piezoelectric layers in the side face of the stacked body.

4. The multi-layer piezoelectric element according to claim 1, wherein the external electrode comprises a glass layer in a surface portion of a joining face with the piezoelectric layers.

5. The multi-layer piezoelectric element according to claim 1, wherein the void is formed in a portion of the piezoelectric layers between mutually adjacent internal electrode layers in the side face of the stacked body.

6. The multi-layer piezoelectric element according to claim 1, wherein the void is formed in a plurality.

7. The multi-layer piezoelectric element according to claim 1, wherein the void is configured to be a closed space.

8. An injection device, comprising:
a container comprising an injection nozzle; and
the multi-layer piezoelectric element according to claim 1, wherein a liquid stored in the container is configured to be injected through the injection nozzle by driving the multi-layer piezoelectric element.

9. A fuel injection system, comprising:
a common rail configured to store high-pressure fuel;
the injection device according to claim 8 configured to inject the high-pressure fuel stored in the common rail;
a pressure pump configured to supply the high-pressure fuel to the common rail; and
an injection control unit configured to send a driving signal to the injection device.

* * * * *